United States Patent [19]

Johnston

[11] Patent Number: 4,675,625

[45] Date of Patent: * Jun. 23, 1987

[54] ROLLED DELAY LINE OF THE COPLANAR LINE TYPE

[75] Inventor: Joseph E. Johnston, Chandler, Ariz.

[73] Assignee: Rogers Corporation, Rogers, Conn.

[*] Notice: The portion of the term of this patent subsequent to Jun. 23, 2004 has been disclaimed.

[21] Appl. No.: 760,818

[22] Filed: Jul. 31, 1985

Related U.S. Application Data

[63] Continuation-in-part of Ser. No. 716,225, Mar. 26, 1985, abandoned.

[51] Int. Cl.$^4$ ............................................. H01P 9/00
[52] U.S. Cl. ...................................... 333/161; 333/23
[58] Field of Search ................. 333/161, 156, 140, 23; 336/200, 232; 29/602 R, 832, 837, 842

[56] References Cited

U.S. PATENT DOCUMENTS 2,440,652  4/1948  Beverly ................................. 333/156
3,670,270  6/1972  Storey, II ............................. 333/161
4,313,095  1/1982  Jean-Frederic ................. 333/161 X

FOREIGN PATENT DOCUMENTS

0743717  1/1956  United Kingdom ................ 336/200

Primary Examiner—Eugene R. LaRoche
Assistant Examiner—Benny T. Lee
Attorney, Agent, or Firm—Fishman & Dionne

[57] ABSTRACT

A time delay device for adjusting the arrival time of an electronic signal at a specific area in a circuit pattern is presented. The time delay device is comprised of a coplanar flexible circuit having a conductive pattern consisting of a signal line in a ground shield. The signal line is serpentine and makes one or more passes back and forth on the dielectric surface of the flexible circuit. The ground plane covers substantially the entire surface of the laminate except for a small gap on either side of the signal line. This circuit laminate is then tightly rolled up and permanently packaged in a suitable sheath or by encapsulation.

34 Claims, 25 Drawing Figures

IN GND OUT

FIG.13B

IN GND OUT

FIG.13c

IN GND OUT

FIG.14A

IN OUT
GND

FIG.14B

IN OUT
GND

ROLLED DELAY LINE OF THE COPLANAR LINE TYPE

CROSS-REFERENCE TO RELATED APPLICATION

This application is a continuation-in-part of U.S. application Ser. No. 716,225 filed Mar. 26, 1985, now abandoned.

BACKGROUND OF THE INVENTION

This invention relates to the field of electronic signal timing delay devices. More particularly, this invention relates to a new and improved electronic component suitable for use on a printed wiring board and which is capable of adjusting the arrival time of signals in high speed logic systems.

It is well known in the electronic circuitry art that for a digital network to function correctly, certain logic variables must change state at accurately controlled points in time relative to one another. As a consequence, the precise control of signals is an important concern in printed circuit board (PCB) or wiring board (PWB) design. This concern has become especially critical with the advent of high speed digital logic networks.

Time delay lines are used in the electronics industry to adjust the timing of electronic signals. As mentioned, signal timing is often critical for the proper operation of a system, particularly for high speed digital systems. In such systems, an integrated circuit may make decisions based upon two or more input signals. If all required inputs do not arrive at roughly the same time, the decision will be faulty. It is not necessary for the inputs to arrive at exactly the same time, but the arrival window becomes smaller and smaller as the speed of the system increases. As the system becomes more complex, the connections from circuit to circuit become longer and, as a result, the connection length for inputs to an integrated circuit may vary greatly. This variability in input connection length causes the transit time in each connection to vary, resulting in non-uniform arrival times. Since it is not possible to speed up the input signals arriving late, the signals arriving early must be delayed. Thus, a delay line is used to effectively increase the length of a travel of a signal, and therefore its transit time. The delay line's electrical characteristics should be as good as the circuit board on which the signals normally travel. Accordingly, it must have controlled impedance, low losses and minimal cross-talk, and it should not degrade the rise time of the signal.

There is a combination of factors present in a digital system which make it virtually impossible to design and build a digital logic network in which the signal propagation times will meet a precise time specification unless an appropriate compensation device, i.e., delay line, is provided. Moreover, because of inaccuracies in various elements of the logic system, the signal timing can only be set by tuning the network after it has been constructed. These inaccuracies are derived from, for example, gate propagation delays varying from the nominal, different lengths of printed circuit tracks, or uncontrolled delays in connectors and other segments of the digital signal paths.

It will be appreciated that the time it takes for an electronic signal to travel from one point to another in a printed circuit track is a function of, and is determined by, the physical length of the track, the line geometry and the substrate characteristics.

Typically, in high speed logic systems such as those employing Emitter Couple Logic (ECL) or gallium arsenide integrated circuits, the necessary signal timing adjustment is effected by the addition of a printed circuit track having a precise length and loaded in a given signal path. This extra length of printed circuitry track acts as a delay line whereby actual propagration delay is determined by the line length and line configuration or layout. This particular approach at controlling the timing of signals has at least two drawbacks. First, the extra length of circuitry track will use up valuable printed circuit real estate thereby incurring higher costs. Second, the characteristic impedance of the delay line is often difficult to control because of layout and construction problems.

Other time delay devices formed as discrete components and suitable for introduction onto a printed wiring board are also found in the prior art. These devices are generally of two types including lumped parameter and distributed parameter delay lines. Lumped parameter delay lines are made up of individual capacitor and inductor stages in series. The total delay is equal to the sum of the inductances multiplied by the sum of the capacitances. Multiple stages are used to smooth out the impedance as well as reduce the degradation in rise time caused by discrete inductors and capacitors. The higher performance the delay line, the more stages are required. Distributed parameter delay lines have distributed inductance and capacitance. Their performance is better than the lumped parameter type, but they are bulkier and restricted to short delays. It will be appreciated that no matter what construction is utilized, the rise time of the above two delay lines is no better than one nanosecond for even short delays. There are also wide variations in impedance within the components which distort high speed signals.

In U.S. patent application Ser. No. 691,193 to Carey and Brumbaugh, now abandoned, assigned to the assignee hereof, all the contents of which are incorporated herein by reference, a new and improved electronic signal timing delay device is disclosed which is comprised of a microstrip flexible circuit rolled up into a compact strip line form. The benefits of this improved delay line of U.S. patent application Ser. No. 691,193 include excellent impedance control, compact package size, better rise times than found in the prior art and reduced distortion of high speed signals.

While suited for its intended purposes, there is a perceived need to further reduce the size of the electronic signal delay device of U.S. patent application Ser. No. 691,193; and there is also a perceived need to further reduce the cost of manufacturing a signal time delay device of the type disclosed in U.S. patent application Ser. No. 691,193.

SUMMARY OF THE INVENTION

The above discussed and other problems of the prior art are overcome or alleviated by the electronic signal timing delay device of the present invention. In accordance with the present invention, a novel signal path delay device is provided by forming a laminate of highly conductive metal bonded to thin, flexible dielectric film. The metal is deposited or etched so as to produce a pattern consisting of a signal line in a ground shield. The signal line is serpentine (i.e., zig-zags) and makes one or more passes back and forth on the dielectric film. A ground plane is also provided via the conductive metal and surrounds the signal line, separated thereby by a small gap on both sides of the line. Two pads or other means are provided at the ends of the signal line to interconnect the same with the circuit in which it is used. This coplanar flexible circuit is then rolled up tightly into a cylindrical shape. Significantly, the serpentine pattern of the signal line must be designed so that when the flexible circuit is rolled up, the signal line will overlap the ground plane of the next layer (not the signal line of the next layer). While there will be some overlap of the signal lines, such overlap should be at right angles and with a minimal break in the ground shield. The rolled circuit should use adhesive to hold it together and to stabilize the effect of the dielectric. Thereafter it may be packaged and marked by a number of well known methods.

The signal delay device of the present invention has many advantages and features over both currently used delay lines as well as over micro strip flexible circuit delay lines of the type disclosed in U.S. patent application Ser. No. 691,193. These several features and advantages will be discussed in more detail hereinafter.

Accordingly, the signal delay device of the present invention will provide a standard electronic component to be used on high speed logic boards, which will provide an accurate fixed time delay for high speed electronic signals. In accordance with the present invention, this time delay will be provided with minimum distortion and degradation of the delayed signal. Additionally, it will be of compact size and extremely economical to manufacture in high volume production.

The above discussed and other advantages of the present invention will be apparent to and understood by those skilled in the art from the following detailed description and drawings.

BRIEF DESCRIPTION OF THE DRAWINGS

Referring now to the drawings, wherein like elements are numbered alike in the Several FIGURES.

DESCRIPTION OF THE PREFERRED EMBODIMENT

Figure 1:
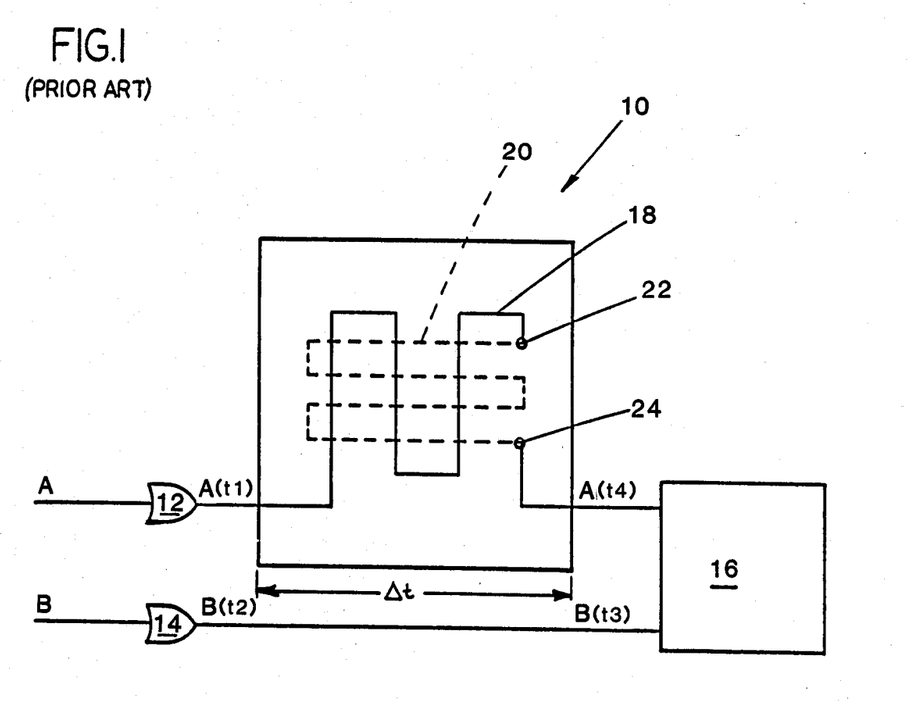
FIG. 1 is a schematic view of a printed circuit track delay line in accordance with the prior art.

Referring first to FIG. 1, a printed circuit track delay line in accordance with the prior art is shown generally at 10. In FIG. 1, "A" and "B" are logic variable inputs (signals). As signal A is faster than signal B, it may be desired to slow down or delay signal A. If signal A is delayed sufficiently, it will take the same amount of time for both signal A and signal B to travel between the logic gates identified at 12 and 14 respectively, and the logic device 16.

As discussed earlier, the electronic signal or logic variable speed is a function of printed circuit track length, track layout or geometry and substrate material. Accordingly, the particular length and geometry of the tracks within box 10 will be such as to slow down the time of signal A to equal signal B, this difference being defined as $\Delta t$. It will be understood that the solid track 18 is representative of a first layer of the printed wiring board while the broken track 20 is indicative of a second PWB layer. The two tracks 18 and 20 are connected at the respective feed thru positions identified at 22 and 24.

In summary, there is a propagation delay for the signal A as it travels through the logic gate 12. The result is a faster signal $A(t_1)$ relative to signal $B(t_2)$. Signal $A(t_1)$ is then sent through a PC track delay line 10 whereby it is slowed by $\Delta t$. Finally, $\Delta t$ is determined so that $A(t_4)$ will be equal to $B(t_3)$. This will result in the A logic variable matching the B logic variable.

As mentioned, the above described prior art method of delaying electronic signals suffers from many enumerated drawbacks including the use of valuable and needed PWB real estate and the lack of precise control in the characteristic impedance of the delay line.

Figure 2:
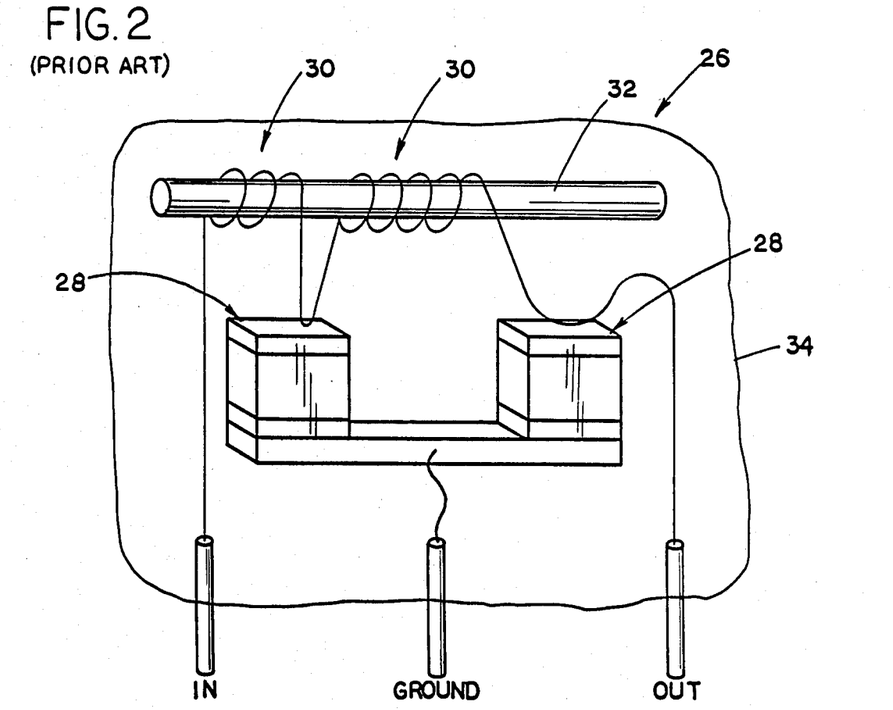
FIG. 2 is a perspective view of a two staged lump parameter delay line in accordance with the prior art.
Figure 3A:
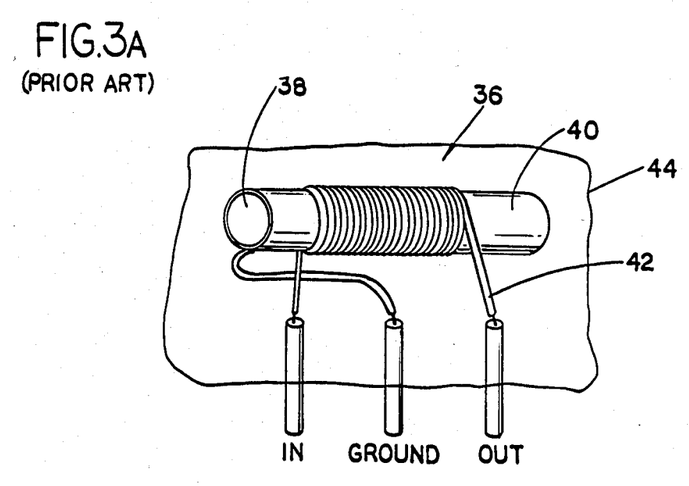
FIG. 3A is a perspective view of a distributed parameter delay line in accordance with the prior art.
Figure 3B:
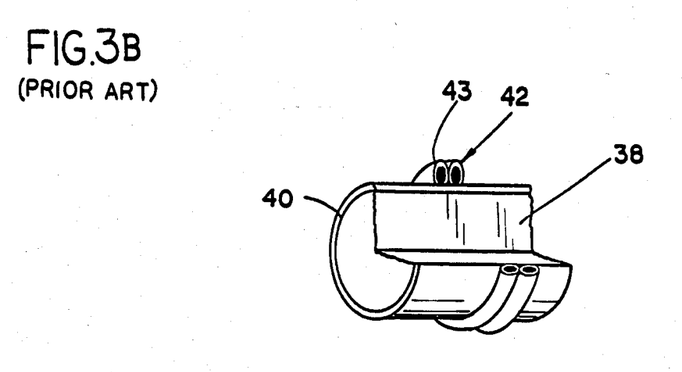
FIG. 3B is a enlarged perspective view, partly in cross-section, of a portion of the distributed parameter delay line of FIG. 3A.

Referring now to FIGS. 2, 3A and 3B, two presently used time delay devices formed as discrete components and suitable for introduction on printed wiring board are shown. In FIG. 2, a lumped parameter delay line is generally shown at 26. Lumped parameter delay line 26 is of the two stage type and is made up of individual capacitor and inductor stages in series. Thus, two multilayer chip capacitors 28 are electrically connected to a pair of inductors 30, the inductors surrounding a plastic core 32. The total delay time is equal to the square root of the sum of the inductances multiplied by the sum of the capacitances or $\sqrt{(\epsilon L)(\epsilon C)}$. Multiple stages are utilized to smooth out the impedance as well as to reduce the degradation in rise time caused by discrete inductors and capacitors. In order to achieve higher performance of the delay line, more stages are required. IN, OUT and GROUND terminals are provided to the capacitor and inductor stages as shown in FIG. 2 and the entire delay line is than encapsulated or otherwise packaged as schematically shown at 34 in FIG. 2.

In FIGS. 3A and 3B, a distributed parameter delay line having distributed inductance and capacitance is shown generally at 36. Typically, distributed parameter delay lines are comprised of a glass rod 38 having a silver ink coating 40 thereon which forms a ground plane. Insulated wire 42 is then wrapped about silver coating 40, the insulation 43 from the wire forming the necessary dielectric (see FIG. 3B). As in the lumped parameter delay line, IN, OUT and GROUND terminals are provided as needed and the entire component is then encapsulated or otherwise packaged as schematically shown at 44 in FIG. 3A. It will be appreciated that the performance of the distributed parameter delay lines are better than the lumped parameter type, however the former is bulkier and restricted to only short delays. As mentioned earlier, there are several deficiencies and drawbacks associated with both prior art delay line components. For example, both constructions shown in FIGS. 2 or 3 will not provide a rise time any better than one nanosecond for even short delays. There are also wide variations in impedance within the components which distort high speed signals.

Figure 4:
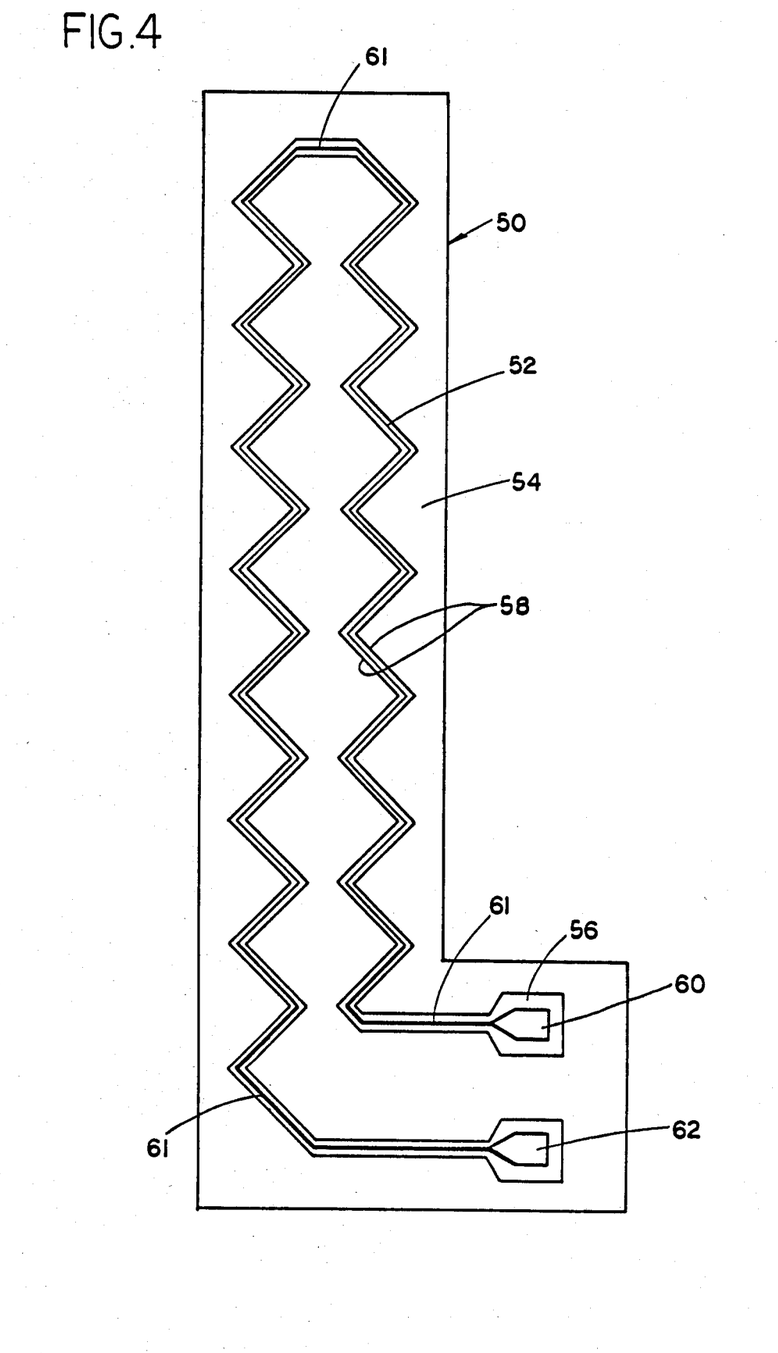
FIG. 4 is a plan view of one embodiment of a circuit laminate, having an opposed serpentine signal line configuration, used in forming an electronic signal timing delay device in accordance with the present invention.

Turning now to FIG. 4, a circuit laminate used in forming an electronic signal time delay device in accordance with the present invention is shown generally at 50. Laminate 50 is comprised of a highly conductive metal bonded to a thin flexible dielectric film or substrate. The metal is deposited or etched so as to produce a circuit pattern consisting of a signal line 52 and a ground shield 54. An important feature of the present invention is that the signal line is serpentine (i.e., zig zags) and makes one or more passes back and forth on the dielectric substrate 56. The ground plane or shield 54 is provided over almost the entire surface of the laminate and is separated from the signal line 52 by a small gap 58 on both side thereof. A pair of terminal pads 60 and 62 are formed at the two ends of the signal lines. Pads 60 and 62 will interconnect the delay device of the present invention with the circuit in which it is to be used.

Figure 5:
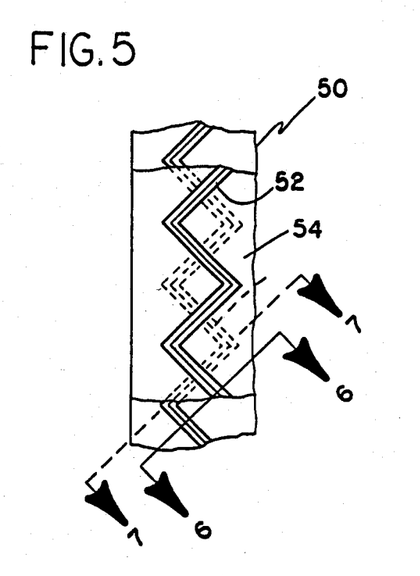
FIG. 5 is a plan view of a portion of the circuit laminate of FIG. 4 subsequent to being rolled and in accordance with the present invention.
Figure 6:
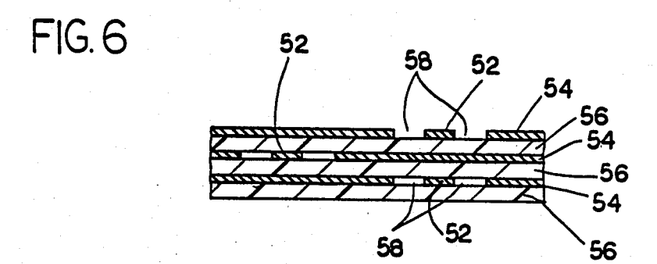
FIG. 6 is a cross-sectional elevation view along the line 6—6 of FIG. 5.
Figure 7:
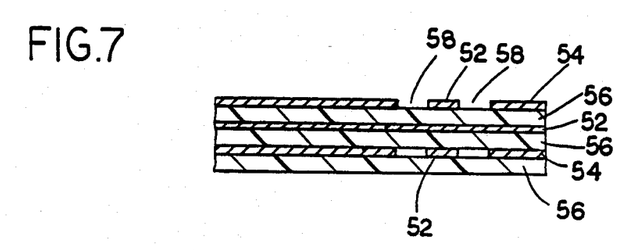
FIG. 7 is a cross-sectional elevation view along the line 7—7 of FIG. 5.

Turning now to FIGS. 5-7, the electronic signal delay line of the present invention is formed by tightly rolling up the coplanar flexible circuit 50 of FIG. 4 into a cylindrical shape. A portion of the rolled coplanar flexible circuit is shown in FIG. 5. It is important that the serpentine pattern of the signal line 52 be designed so that when the flexible circuit is rolled up, the signal line 52 overlaps the ground plane 54 of the next layer; and not the signal line. Of course there must be some overlap of adjacent signal lines from adjacent overlapping layers, but these signal lines should be preferably overlapped at right angles with respect to adjacent signal lines and with a minimal break in the ground shield. The preferred orientation of the rolled serpentine signal lines of the present invention is best shown in the cross-sectional FIGS. 6 and 7.

Subsequent to flexible circuit laminate 50 being rolled, it will be appreciated that the inner layers of the circuit laminate will become effectively a strip line construction while the first and last layers will be of micro strip construction. Preferably, the areas of micro strip construction i.e., first and last layers, should have a signal line width which is approximately twice as wide as the width of the signal line in the strip line section. The wider width of the signal line in the micro strip section of the circuit laminate 50 is shown at 61 in FIG. 4.

Figures 8, 9:
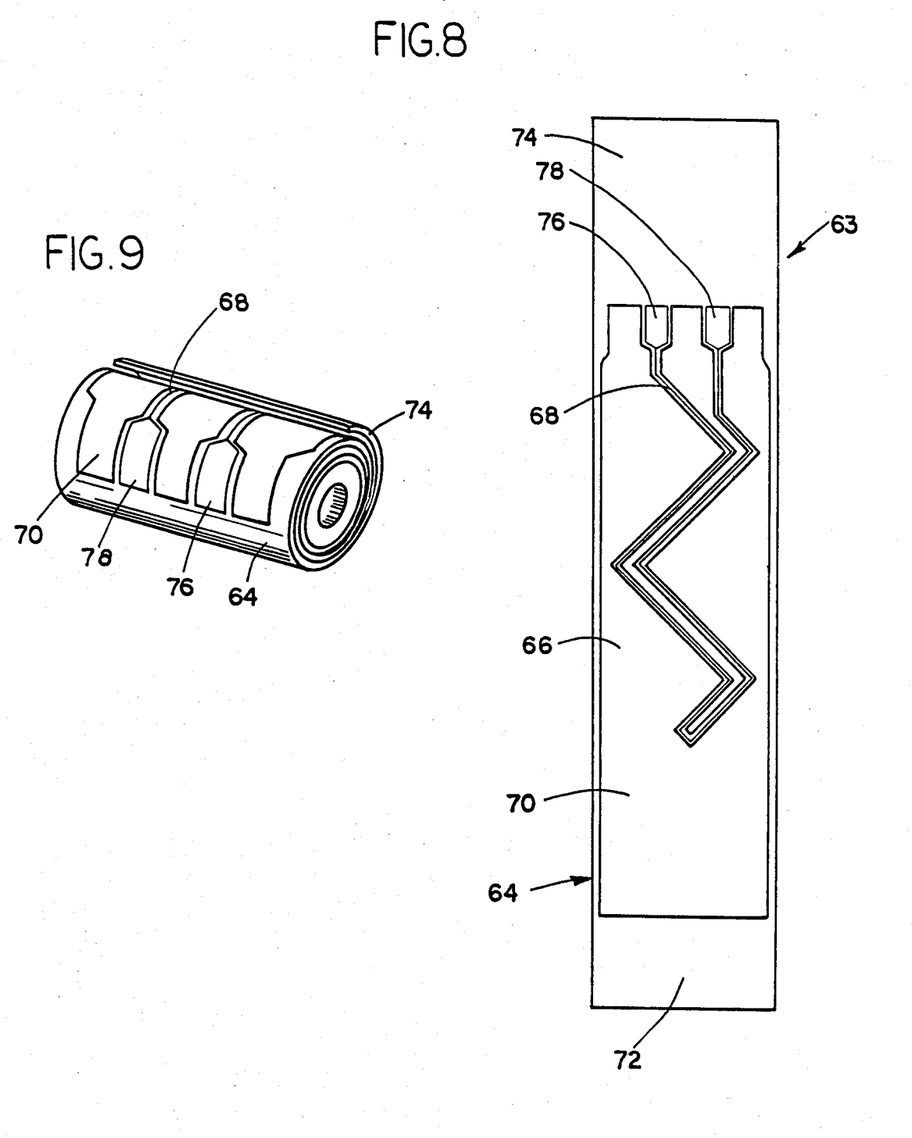
FIG. 8 is a plan view of another embodiment of a circuit laminate, having a parallel serpentine signal line configuration, used in forming an electronic signal timing delay device in accordance with the present invention.
FIG. 9 is a perspective view of the circuit laminate of FIG. 8 subsequent to being rolled.

In an alternative embodiment of the present invention, the necessity for varying the line width of the innermost and outermost layers is precluded by eliminating the micro strip region in the inner most and outer most layers. Thus, in FIG. 8, a flexible circuit laminate is shown generally at 63 and comprises a nonconductive flexible substrate 64 having a conductive circuit layer thereon consisting of ground plane 66 and serpentine signal line 68. However, unlike the circuit laminate of FIG. 4, the flexible circuit laminate 63 of FIG. 8 includes an overlap ground area 70. It will be appreciated that this overlap ground area 70 will be the first layer in the roll. As a result, all subsequent layers will be of the strip line type. An additional extension of the base substrate material 64 shown at 72 may be used in conjunction with the overlap ground area 70 to form a protective or insulative covering for the ground thereby making the inner packaging complete. In packaging the delay line, an outer cover area shown at 74 which is simply an extension of base material 64 may be used. Thus, after the active portion of circuit laminate 62 has been rolled up, the outer cover area 74 may be rolled on as a protective cover layer, leaving only the pads 76 and 78 exposed (FIG. 9). It will be appreciated that logos and delay values could be printed on this layer either before or after rolling as desired.

Figure 10:
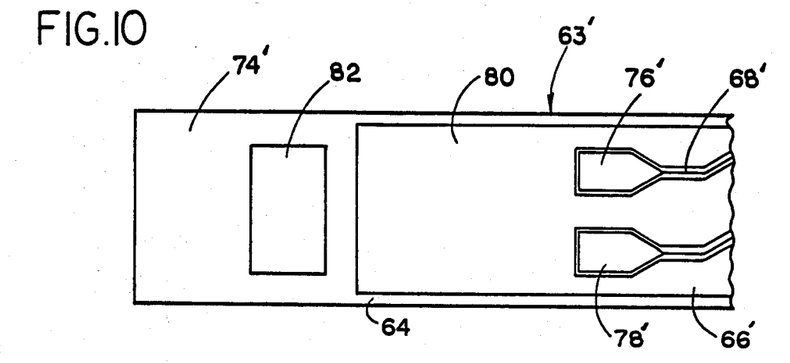
FIG. 10 is a plan view of a portion of still another circuit laminate used in forming an electronic signal timing delay device in accordance with the present invention.
Figure 11:
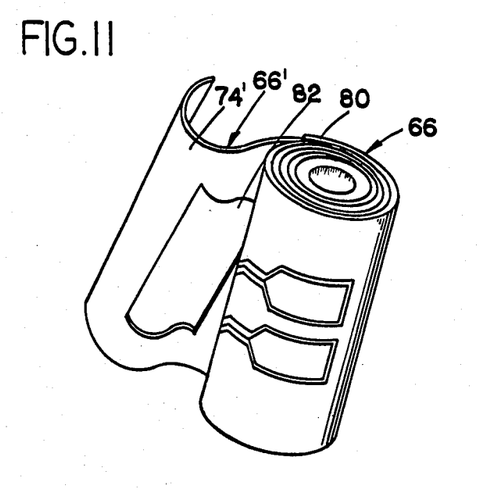
FIG. 11 is a perspective view of the circuit laminate of FIG. 10 partially rolled.
Figure 12:
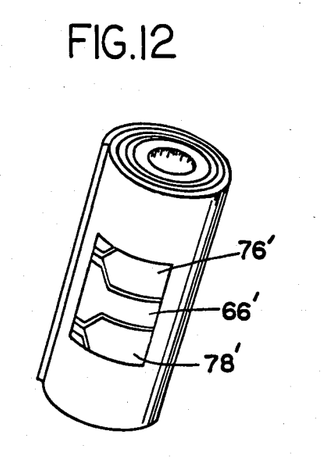
FIG. 12 is a perspective view of the circuit laminate of FIG. 10 subsequent to being rolled.

In FIGS. 10-12, still another alternative embodiment of the present invention is shown which also makes the outer most circuit layer to be of the strip line construction. FIG. 10 includes a signal line 68' in flexible circuit 63'. Thus, in FIG. 12, a ground plane extension area having no signal formed therein is provided at 80 and extends past terminal pads 76' and 78'. Ground plane extension 80 may be wrapped around the outer circuit layer to form a strip line construction. The company logo and markings may also be etched on the ground plane. Preferably, a window 82 is provided in the base substrate material extension 74' to form openings for the three connector pads 76', 78' and ground plane 66'.

Figure 15:
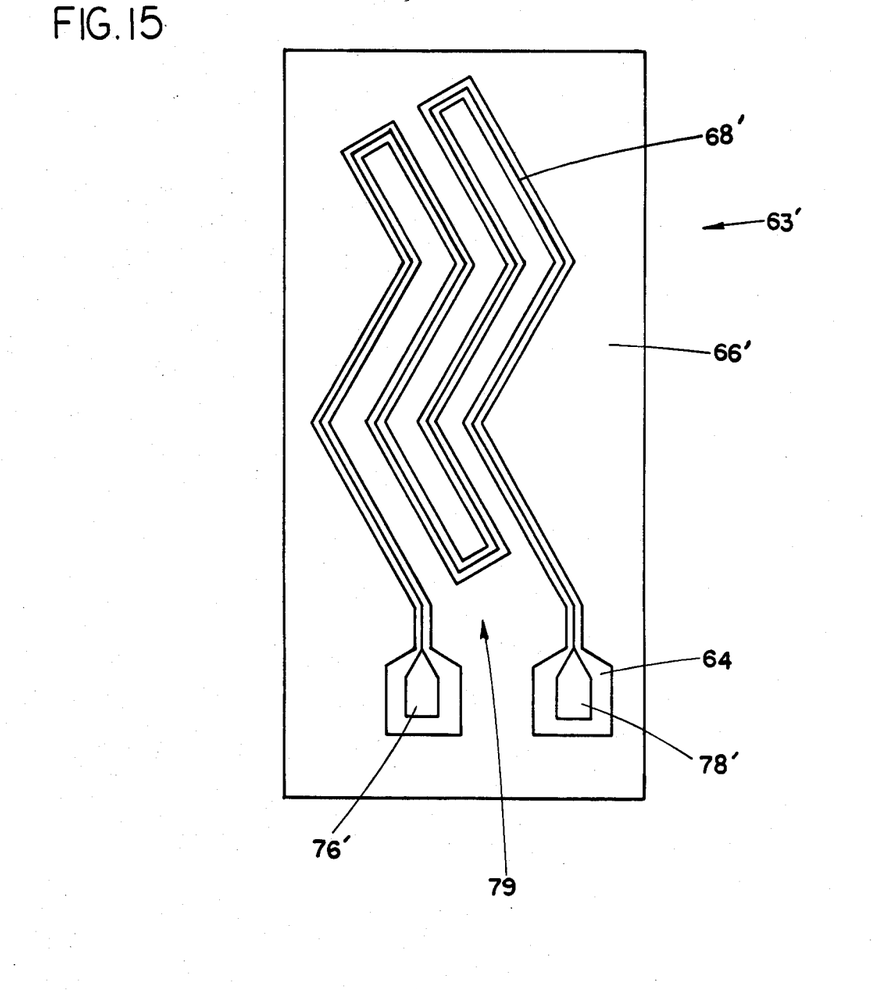
FIG. 15 is a plan view of a circuit laminate having a multi-pass parallel serpentine signal line configuration.

It will be appreciated that the serpentine signal line 68 of FIG. 8 has a different configuration than the serpentine configuration 61 in FIG. 4. In FIG. 4, the serpentine signal line 61 doubles back on itself in an opposing zig-zag configuration. In contrast, the serpentine signal line 68 of FIG. 5 doubles back on itself in a parallel zig-zag configuration. The signal line configuration of FIG. 8 has the advantage of permitting reduced overall width for the delay line package thereby permitting smaller overall delay line packages and reducing the amount of real estate used on the circuit board. However, the parallel serpentine signal line orientation has a disadvantage of possibly increasing the deleterious effects of signal line overlaps in that there are twice as many overlaps per device in FIG. 8 relative to the opposed serpentine signal line orientation of FIG. 4. In FIG. 15, a parallel or compressed serpentine signal line configuration, similar to signal line 68 in FIG. 8, is shown at 68' in flexible circuit laminate 63'. The FIG. 15 embodiment is an example of a multi-pass parallel serpentine configuration wherein the signal line doubles back on itself for a second pass at U-turn 79 which permits smaller overall width and high density circuit patterns. Of course, any number of serpentine passes may be used with the FIG. 15 (or FIG. 4) embodiments.

Figure 16:
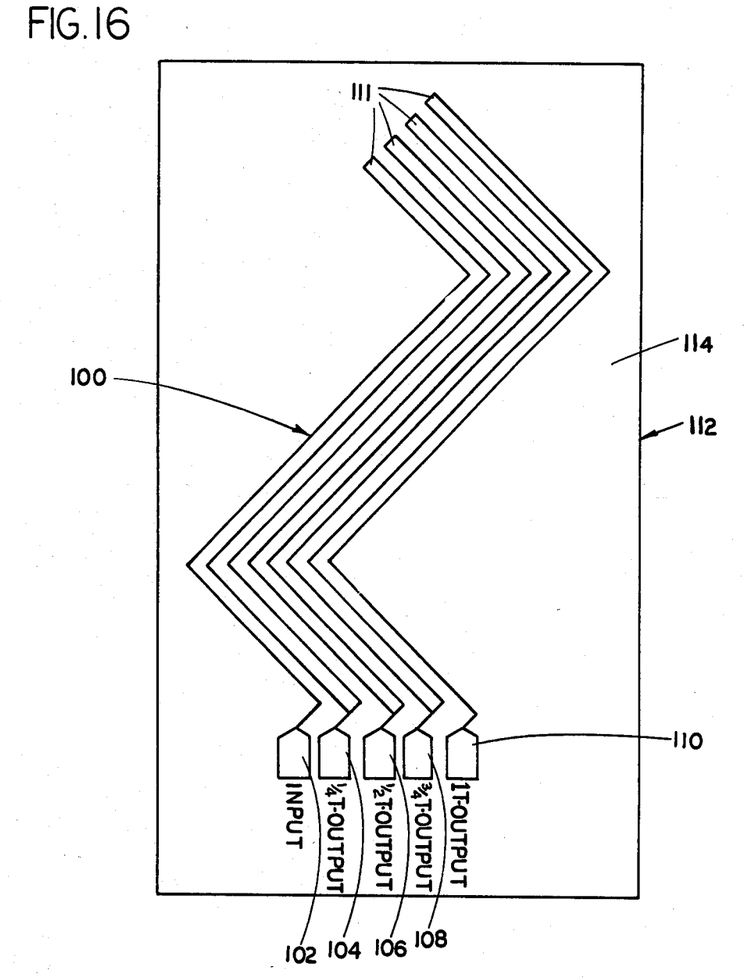
FIG. 16 is a plan view of a circuit laminate having a plurality of output taps for varying the amount of signal line delay time in accordance with the present invention.

The delay lines discussed heretofore have all had a single selected signal delay time depending upon the length of the serpentine signal line. However, referring now to FIG. 16, a single signal delay device having multiple delay times is possible by utilizing a signal line configuration such as was discussed with regard to FIG. 15 (multi-pass parallel serpentine configuration) in conjunction with multiple taps. Thus, in FIG. 16, a multi-pass compressed serpentine signal line is shown generally at 100 and includes an input tap 102 and a plurality of output taps 104, 106, 108 and 110. Each output tap 104–110 is placed at a position which is diametrically opposed from the U-turns 111 of signal line 100. The total delay time of the flexible delay circuit shown in FIG. 16 is equal to a delay time of 1(T) will be provided by connections to output 110. Similarly, smaller delay times may be accessed by connections to output tap 108 ($\frac{3}{4}$)T output 106 ($\frac{1}{2}$)T and output tap ($\frac{1}{4}$). Thus, by using a delay line configuration such as is shown in FIG. 16, it is possible to provide a plurality of signal delay times in a single signal delay device. It will be appreciated that for the purposes of clarity and understanding, the signal lines 100 and flexible circuit sheet 112 have been shown without any spacing between the signal line and the ground plane 114. Accordingly it should be understood that in actual practice, ground plane 114 will terminate at a selected distance from signal lines 100, and input and output taps 102–110 to provide the necessary insulative gap therebetween.

Figure 17:
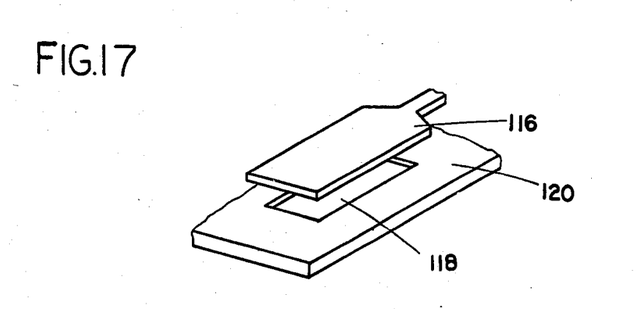
FIG. 17 is a perspective view of a portion of the circuit laminate of FIG. 16 showing reduced capacitance output pads or taps.

The multi-tap delay line shown in FIG. 16 may be a preferable embodiment in that the single signal delay device having multiple delay times therein may replace a plurality of the delay devices which each have only a single delay time. This feature would provide decreased manufacturing and inventory costs; as well as providing increased flexibility to the electronic circuit designer. However, one problem inherent with such a signal line configuration is that the multiple taps represent discontinuities which will degrade the signal transmission characteristics of the signal delay device. In an effort to alleviate this problem, each output pad is preferably loaded in a cutout in the ground plane so as to reduce pad capacitance. Thus, in FIG. 17, an output pad or tap 116 is shown prior to being loaded into a cutout or cavity 118 in ground plane 120.

Figures 18, 19:
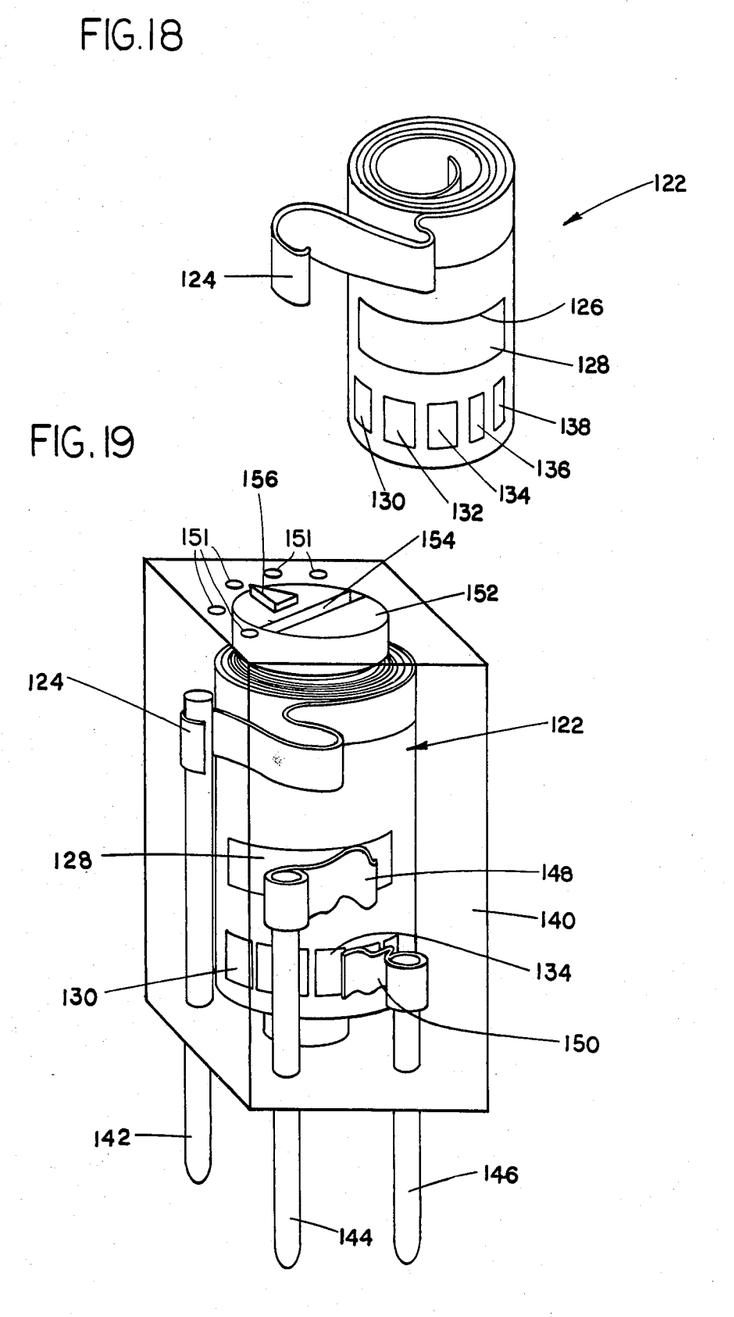
FIG. 18 is a perspective view of a circuit laminate similar to the laminate in FIG. 16, after rolling.
FIG. 19 is a perspective view of the multi-tap circuit laminate of FIG. 18 after packaging.

In a preferred embodiment, the multi-tap delay line of FIG. 16 may be rolled on itself into a cylindrical configuration as generally shown at 122 in FIGS. 18 and 19. In FIG. 18, a corner of the rolled circuit laminate of the present invention has a longitudinal slit therein which provides a flexible ground ribbon 124. An opening 126 is made through the circuit laminate to expose the relatively large input pad 128. A plurality of multiple output pads or taps are disposed beneath input pad 128 and are identified at 130, 132, 134, 136, 138 in FIG. 18. It will be appreciated that the laminate material bordering input pad 128 and output taps 130, 132, 134, 136, 138 will consist of the nonconductive flexible substrate portion of circuit laminate 122.

Referring now to FIG. 19, rolled circuit laminate 122 may be loaded into a rectangular or other shaped housing or package 140 which is provided with three conductive pins including ground pin 142, input pin 144 and output pin 146. These conductive pins are respectively connected to ground ribbon 124, input pad 128 and one of the output taps 130, 132, 134, 136, 138. Input and output pins 144 and 146 make electrical contact with the respective input pads and output taps via flexible contacts 148 and 150. On the top surface of package 140 are indicia 151 which correspond to the plurality of output taps 130, 132, 134, 136, 138. A selective button in the form of a screw 152 having an adjusting slot 154 and a arrow shaped indicator 156 is attached to rolled circuit laminate 122.

During operation, selector button 152 is rotated either clockwise or counter-clockwise via slot 154 to a selected output time identified by indicia 151. As selector button 152 is rotated, circuit laminate 122 will revolve whereby output pin 146 having electrical contact 150 thereon will make electrical contact with either one of output taps 130, 132, 134, 136, 138. Note that regardless of which output tap 130, 132, 134, 136, 138 that output pin 146 is in contact with, input pin 144 having electrical contact 148 thereon will remain in constant contact with input pad 128 while ground pin 142 will also remain in constant contact with ground ribbon 124. It will be appreciated that while ground, input and output pins 142, 144 and 146 suitable for insertion into a printed circuit board have been shown, pins 142, 144, 146 could be replaced with appropriate pads for surface mounted application.

Figure 13A:
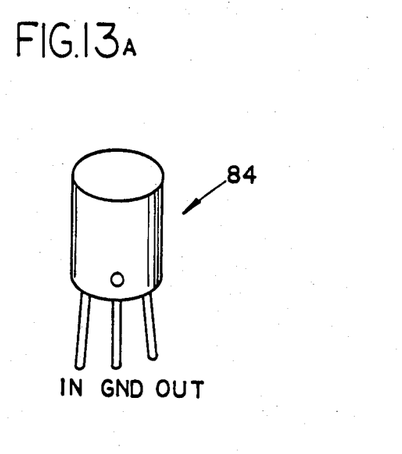
FIGS. 13A–13C are examples of final packages used for through hole mounting of an electronic signal timing delay device in accordance with the present invention.
Figure 13B:
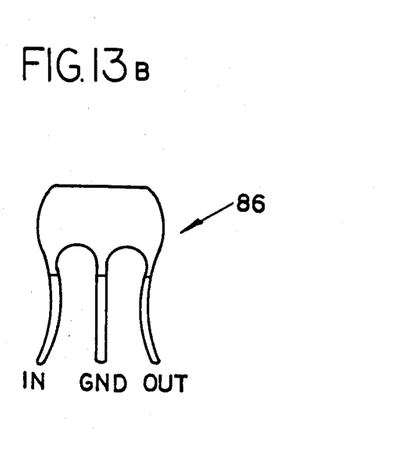
Figure 13C:
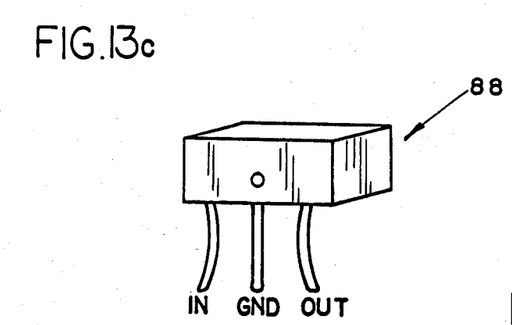

The rolled circuit laminate of the present invention preferably utilizes an appropriate adhesive to bond the individual layers together and to help stabilize the effect of the dielectric constant thereof. Thereafter, the rolled laminate may be packaged as desired. For example, in FIGS. 13A, 13B and 13C, molded, dipped, and back filled packagings are shown respectively at 84, 86 and 88. As is well known, these packages are well suited for effecting through hole mounting of the electronic signal time delay device of the present invention.

Figure 14A:
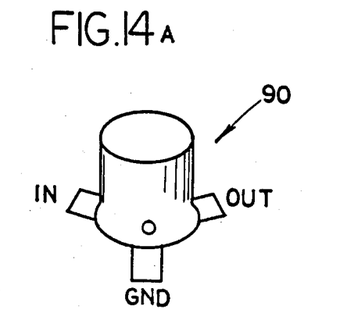
FIGS. 14A and 14B are examples of packaging used for surface mounting of an electronic signal timing delay device in accordance with the present invention.
Figure 14B:
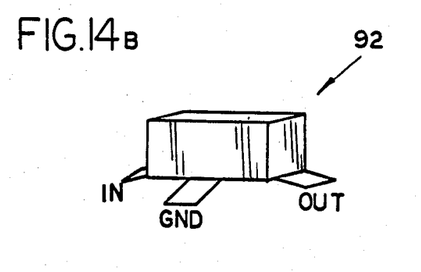

Alternatively, the signal pad and ground pad patterns may be designed to accommodate surface mounting. Such surface mounting packages are shown respectively at 90 and 92 in FIGS. 14A and 14B.

Figure 20:
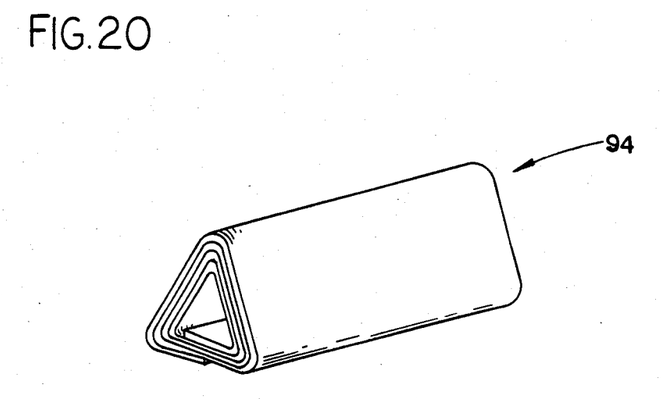
FIG. 20 is a perspective view of a circuit laminate in accordance with the present invention rolled in a triangular configuration.
Figure 21:
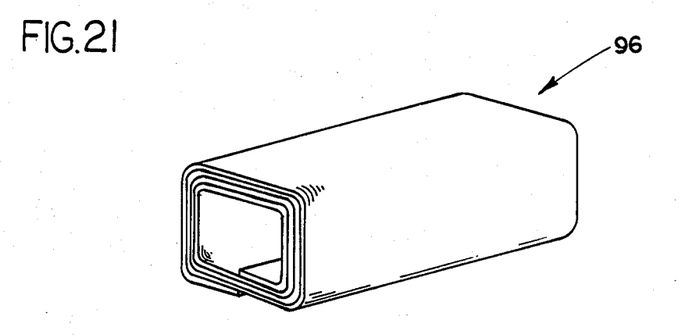
FIG. 21 is a perspective view of a circuit laminate in accordance with the present invention rolled in a rectangular configuration.

It will be appreciated that the shape of the rolled circuit laminate need not be cylindrical. It could be rolled on a triangular, square or other shaped arbor or spindle to make the package easier to orient on a printed circuit board, particularly for surface mounted packages. Thus, in FIGS. 20 and 21, a triangular shaped rolled laminate and a rectangular-shaped rolled laminate are respectively shown at 94 and 96. In order to retain the desired non-cylindrical shape, the adhesive material between the rolled layers of circuit laminate would need to be partially cured on the arbor to ensure that the shape stays fixed once the laminate has been released.

It will also be appreciated that the present invention may include any other suitable packaging scheme such as injection molding, shrink tubing and metal containers, and should not be limited to the particular packaging schemes shown in FIGS. 13, 14, 20 and 21.

The signal and ground patterns formed on the circuit laminate of the present invention may be manufactured by either additive or subtractive processes and may be of any geometry required to maintain a given impedance, control cross-talk, improved rise time and reduced signal line overlap. The signal line width, as well as the gap separating it from the ground plane, may vary. Similarly, the laminate material may be varied as necessary. Fillers may be used to change dielectric constant, permeability or physical properties. Also, composite films may be used in conjunction with the circuit laminate of the present invention. As mentioned, adhesives may be used as required to hold the circuit together as well as to improve electrical properties. Also, high permeability/permitivity dielectrics and/or adhesives may be used to increase the delay of the device. Finally, the delay time and impedance for each delay line can be set at any appropriate value.

The electronic signal timing delay line of the present invention includes many features and advantages over prior art delay lines. These advantages include improved impedance control and uniformity; improved rise times to delay ratio for short delays (less than 2 to 5 nanoseconds); reduced packaging size for short delays; reduced signal distortion; adaptability for surface mounting; low manufacturing and fabrication costs; and the ability to provide delays in the sub-nanosecond range.

Moreover, the electronic signal time delay device of the present invention also includes certain features and advantages over the micro strip flexible circuit delay line disclosed in U.S. patent application Ser. No. 691,193. For example, the present invention permits reduced manufacturing costs because there is no separate ground layer and cover film as is necessitated with the delay line of the prior application. Also, for the same signal line width, the outer package diameter is significantly reduced, especially for longer delays. Similarly, for the same package diameter, the signal line can be twice as wide and the dielectric twice as thick. As a result, manufacturing variations in tolerance will have less impact upon electrical characteristics. This is a particularly significant feature as the typical line width would be increased from 2-3 mils to 4-6 mils with the delay device of the present invention.

Yet another feature of the present invention is that single sided access to input, output and ground pads is provided. It is also conceivable that the present invention provides some improvement in electrical performance over the delay device of prior U.S. patent application Ser. No. 691,193 by virtue of the "semi-coaxial" construction. Thus, because there are top and bottom ground shields as well as shields on both sides of the signal line, this construction may actually improve electrical performance relative to the earlier disclosed micro strip flexible circuit delay line.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An electronic signal time delay device for use in a circuit pattern comprising:
   coplanar flexible circuit means, said flexible circuit means including a nonconductive substrate having opposed surfaces, said substrate including electrically conductive material disposed on one of said opposed surfaces;
   said conductive material consisting of a ground plane with a signal line therein, said signal line being separated from said ground plane via a gap on both sides of said signal line;
   said coplanar flexible circuit means having a longitudinal dimension and being rolled along said longitudinal dimension;
   said signal line has a zigzag configuration along said longitudinal dimension;
   wherein said rolled flexible circuit means defines a plurality of layers, said layers comprising alternating layers of nonconductive substrate and conductive material, and wherein;
   at least the interior layers of said rolled circuit means consist of said nonconductive substrate being sandwiched between said conductive material as to define a stripline circuit; and
   wherein the zigzag configuration of the signal line from one layer is substantially opposed from the ground plane of an adjacent layer whereby substantially all of the signal line in one layer overlaps the ground plane in an adjacent layer.

2. The device of claim 1 wherein:
   the innermost and outermost layers of said rolled circuit means consist of said nonconductive substrate adjacent a single layer of conductive material as to define a microstrip circuit.

3. The device of claim 2 wherein:
   said signal line has a selected width; and wherein
   said signal line in said microstrip circuit has a wider width than said signal line in said stripline circuit.

4. The device of claim 3 wherein:
   said signal line in said microstrip circuit is about twice the width as said signal line in said stripline circuit.

5. The device of claim 1 wherein:
   the zigzag configuration of the signal line from one layer is offset from the zigzag configuration of a signal line from an adjacent layer whereby the signal line from one layer overlaps the signal line from an adjacent layer at about a 90 degree angle.

6. The device of claim 1 wherein:
   said ground plane covers substantially all of said nonconductive substrate except for said signal line and said gap.

7. The device of claim 1 wherein:
   said ground plane has a first end and a second end, said first and second ends being substantially coterminous with said signal line; and including
   a first ground plane extension extending along said longitudinal dimension from said first end of said ground plane, said first ground plane extension having no signal line therein.

8. The device of claim 7 including:
   a second ground plane extension extending along said longitudinal dimension from said second end of said ground plane, said second ground plane extension having no signal line therein.

9. The device of claim 7 wherein:
   said nonconductive substrate extends outwardly along said longitudinal dimension beyond said first ground plane extension.

10. The device of claim 1 wherein:
said ground plane has a first end and a second end;, said first and second ends being substantially coterminous with said signal line and including
a second ground plane extension extending along said longitudinal dimension from said second end of said ground plane, said second ground plane extension having no signal line therein.

11. The device of claim 10 wherein:
said nonconductive substrate extends outwardly along said longitudinal dimension beyond said second ground plane extension.

12. The device of claim 11 including:
first means for connecting said signal line to said circuit pattern; and
second means for connecting said ground plane to said circuit pattern.

13. The device of claim 12 including:
a window formed in said extended nonconductive substrate for accessing said first and second connecting means.

14. The device of claim 1 including:
first means for connecting said signal line to said circuit pattern; and
second means for connecting said ground plane to said circuit pattern.

15. The device of claim 14 wherein:
said first connecting means comprises a pair of connection pads on said nonconductive substrate, said pair of connection pads being connected to opposed ends of said signal line; and
said second connecting means comprises a connection pad on said nonconductive substrate.

16. The device of claim 1 including:
adhesive between said layers for holding said rolled flexible circuit means together.

17. The device of claim 1 wherein:
said signal line zig-zag configuration includes at least two interconnected laterally spaced circuit traces, and wherein said laterally spaced circuit traces are in opposing zig-zag orientations.

18. The device of claim 1 wherein:
said signal line zig-zag configuration includes at least two interconnected laterally spaced circuit traces, and wherein said laterally spaced circuit traces are in parallel zig-zag orientations.

19. The device of claim 18 wherein:
said signal line further includes a plurality of interconnected laterally spaced circuit traces; and including
input connecting means for connecting said signal line to said circuit pattern;
output connecting means for connecting said signal line at a plurality of taps therealong and connecting said signal line to said circuit pattern at one of said taps; and
ground connecting means for connecting said ground plane to said circuit pattern.

20. The device of claim 19 including:
means for selectably positioning said output connecting means at one of said plurality of taps.

21. The device of claim 20 wherein:
said ground plane includes a flexible ground ribbon and wherein said ground connecting means is connected to said flexible ground ribbon.

22. The device of claim 19 including:
a depression in said ground plane at each of said plurality of taps; and
said output connecting means being disposed into said cavity.

23. An electronic signal time delay device for use in a circuit pattern comprising:
coplanar flexible circuit means, said flexible circuit means including a nonconductive substrate having opposed surfaces, said substrate including electrically conductive material disposed on one of said opposed surfaces;
said conductive material consisting of a ground plane with a signal line therein, said signal line being separated from said ground plane via a gap on both sides of said signal line;
said coplanar flexible circuit means having a longitudinal dimension and being rolled along said longitudinal dimension;
said signal line includes a plurality of interconnected laterally spaced circuit traces; and including
input connecting means for connecting said signal line to said circuit pattern;
output connecting means for accessing said signal line at a plurality of taps therealong and connecting said signal line to said circuit pattern at one of said taps; and
ground connecting means for connecting said ground plane to said circuit pattern.

24. The device of claim 23 including:
means for selectably positioning said output connecting means at one of said plurality of taps.

25. The device of claim 24 wherein:
said ground plane includes a flexible ground ribbon and wherein said ground connecting means is connected to said flexible ground ribbon.

26. The device of claim 23 including:
a depression in said ground plane at each of said plurality of taps; and
said output connecting means being disposed into said depression.

27. An electronic signal time delay device for use in a circuit pattern comprising:
coplanar flexible circuit means, said flexible circuit means including a nonconductive substrate having opposed surfaces, said substrate including electrically conductive material disposed on one of said opposed surfaces;
said conductive material consisting of a ground plane with a signal line therein, said signal line being separated from said ground plane via a gap on both sides of said signal line;
said coplanar flexible circuit means having a longitudinal dimension and being rolled along said longitudinal dimension;
said signal line having a zigzag configuration along said longitudinal dimension;
said signal line; includes a plurality of interconnected laterally spaced circuit traces; and including
input connecting means for connecting said signal line to said circuit pattern;
output connecting means for connecting said signal line at a plurality of taps therealong and connecting said signal line to said circuit pattern at one of said taps; and
ground connecting means for connecting said ground plane to said circuit pattern.

28. The device of claim 27 including:
means for selectably positioning said output connecting means at one of said plurality of taps.

29. The device of claim 28 wherein:

said ground plane includes a flexible ground ribbon and wherein said ground connecting means is connected to said flexible ground ribbon.

30. The device of claim 27 including:
a depression in said ground plane at each of said plurality of taps; and
said output connecting means being disposed into said depression.

31. The device of claim 1 wherein:
said coplanar flexible circuit means is rolled into a cylindrical configuration.

32. The device of claim 1 wherein:
said coplanar flexible circuit means is rolled into a triangular configuration.

33. The device of claim 1 wherein:
said coplanar flexible circuit means is rolled into a rectangular configuration.

34. An electronic signal time delay device for use in a circuit pattern comprising:
coplanar flexible circuit means, said flexible circuit means including a nonconductive substrate having opposed surfaces, said substrate including electrically conductive material disposed on one of said opposed surfaces;
said conductive material consisting of a ground plane with a signal line therein, said signal line being separated from said ground plane via a gap on both sides of said signal line;
said coplanar flexible circuit means having a longitudinal dimension and being rolled along said longitudinal dimension;
said ground plane has a first end and a second end; and including
a second ground plane extension extending along said longitudinal dimension from said second end of said ground plane, said second ground plane extension having no signal line therein;
said nonconductive substrate extending outwardly along said longitudinal dimension beyond said second ground plane extension;
first means for connecting said signal line to said circuit pattern;
second means for connecting said ground plane to said circuit pattern; and
a window formed in said extended nonconductive substrate for accessing said first and second connecting means.

* * * * *